United States Patent [19]

Désormière

[11] Patent Number: 4,563,646

[45] Date of Patent: Jan. 7, 1986

[54] OPTICAL MAGNETOMETER USING A LASER COUPLED TO A MAGNETO-OPTICAL MEDIUM

[75] Inventor: Bernard Désormière, Paris, France

[73] Assignee: Thomson CSF, Paris, France

[21] Appl. No.: 482,285

[22] Filed: Apr. 5, 1983

[30] Foreign Application Priority Data

Apr. 6, 1982 [FR] France .................. 82 05967

[51] Int. Cl.$^4$ .................. G01R 33/02; G02F 1/09
[52] U.S. Cl. .................. 324/244; 350/375
[58] Field of Search .................. 324/244, 96; 350/375, 350/376, 377, 378; 372/21, 26

[56] References Cited

U.S. PATENT DOCUMENTS

| 3,786,681 | 1/1974 | Kiehn | 372/27 |
| 4,370,612 | 1/1983 | Puech et al. | 324/96 |

FOREIGN PATENT DOCUMENTS

| 0004321 | 10/1979 | European Pat. Off. |
| 0023180 | 1/1981 | European Pat. Off. |
| 0044572 | 1/1982 | European Pat. Off. |
| 0046298 | 2/1982 | European Pat. Off. |
| 2355299 | 1/1978 | France |

Primary Examiner—Gerard R. Strecker
Assistant Examiner—Walter E. Snow
Attorney, Agent, or Firm—Cushman, Darby & Cushman

[57] ABSTRACT

An optical magnetometer for measuring the component h of a magnetic field in a direction x by the Faraday effect. A semiconductor laser produces two laser beams which are directed from opposite faces of the laser in opposite directions along two fiber optic cables. The opposite beams of light enter a magneto-optical medium and then continue via the opposite fiber optic cable to return to the laser where the two light beams are recoupled. An alternating magnetic field at frequency f and a compensation field are applied to the magneto-optical medium in a direction parallel to the direction x to produce the Faraday effect. The laser intensity of the recoupled light beams is proportional to the magnetic field to be measured. A photodetector samples portions of the recoupled light beam and provides a current $i_d$ which is proportional to the recoupled beam intensity. The current $i_d$ is filtered at frequencies f, for compensating the field h to be measured, and 2f. The magneto-optical medium used is preferably formed by a substituted YIG ferrimagnetic layer, grown by epitaxy on a nonmagnetic garnet.

10 Claims, 5 Drawing Figures

OPTICAL MAGNETOMETER USING A LASER COUPLED TO A MAGNETO-OPTICAL MEDIUM

BACKGROUND OF THE INVENTION

The present invention relates to an optical magnetometer able to detect weak magnetic fields of approximately $10^{-5}$ A/m.

It is known to measure the rotation of the polarization plane of linear polarized light supplied by a laser on traversing a magnetooptical medium subject to a magnetic field. This rotation, known as a Faraday rotation, is a function of the value of the component of the magnetic field parallel to the propagation direction, which makes it possible to obtain a field measurement by measuring said rotation.

SUMMARY OF THE INVENTION

The present invention leads to improvements in the performance of the prior art optical magnetometers by recoupling the optical beam which has traversed the medium in the laser source cavity.

The invention specifically relates to an optical magnetometer for measuring the component h of a magnetic field in a direction x, comprising a laser source supplying a linear polarized light to a magnetooptical medium having the Faraday effect, which it traverses parallel to the direction x, wherein the optical beams leaving by the two faces $f_1$ and $f_2$ of the laser traverse the magnetooptical medium in opposite directions and following said passage, these two beams are recoupled in the laser, the beam leaving by face $f_1$ being recoupled by face $f_2$ and the beam leaving by face $f_2$ being recoupled by face $f_1$, whilst the magnetic field is measured on the basis of the current $i_d$ supplied by a photodetector receiving part of the optical power of the laser.

BRIEF DESCRIPTION OF THE DRAWINGS

Other features and advantages of the invention can be gathered from the following description with reference to the drawings, which show.

DETAILED DESCRIPTION OF THE INVENTION

The magnetometer according to the invention combines a magnetooptical medium and a laser, which is preferably a semiconductor laser. It involves the combination of the magnetic circular birefringence effect, which occurs when light waves traverse a magnetooptical medium and which is responsible for the Faraday effect and the modulation effect of the laser emission by an optical feedback exerted on the laser cavity. The measurement of the magnetic field is deduced from the measurement of the current intensity at the output of a photodetector intercepting the resulting laser emission.

Figure 1:
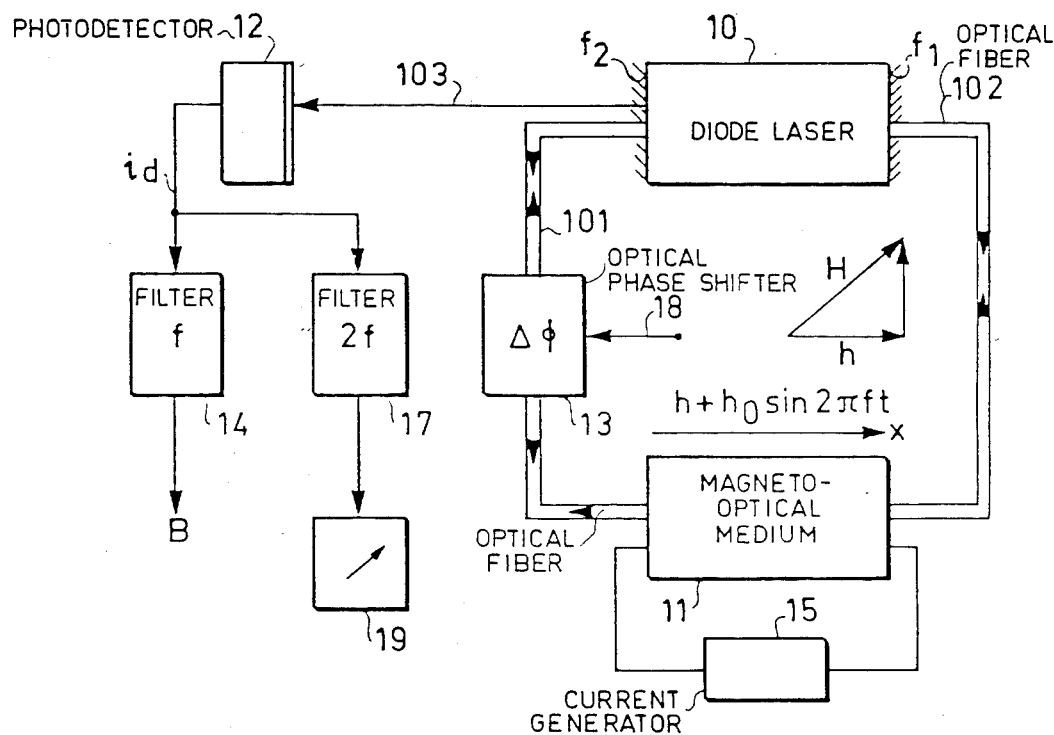
FIG. 1 is a circuit diagram of the magnetometer according to the invention.

The general block diagram of the magnetometer is shown in FIG. 1. It comprises a semiconductor laser source 10 of the type having a polarized junction or "laser diode". The two light beams 101, 102 emerging from the two opposite faces $f_1$ and $f_2$ of the laser diode, pass through a magnetooptical medium 11 in opposite directions. Each beam is recoupled into the optical cavity of the laser diode in such a way that it enters it by the opposite face to that used on emission. Thus, the two beams interfere in the optical cavity with the stored energy. Preferably, and as shown in the drawing, the optical beams propagate in an optical fiber.

The light emitted by the laser and whose injection current is higher than the threshold current, is essentially polarized in a linear manner in accordance with the TE mode and is monomode.

In the presence of a magnetic field H, the magnetooptical medium 11 rotates the polarization plane of linear light by a magnetic circular birefringence effect or Faraday effect. As the Faraday rotation is independent of the light propagation direction, it takes place in the same direction for both beams 101 and 102. The magnetooptical medium is chosen so that the Faraday rotation angle is proportional to the component h of the magnetic field H, parallel to the propagation direction x of the light in the medium. Part of the resulting laser emission 103 is intercepted by a photodetector 12 in order to obtain the measurement signal.

For each beam recoupled into the cavity, the Faraday rotation leads to a modification of the amplitude of the associated luminous vibration and it undergoes a phase shift due to the traversed optical media. A double optical feedback is exerted on the cavity and leads to a modulation of the intensity supplied by the laser diode, which is a function of the direction of the polarization plane. This intensity is a function of the Faraday rotation angle and of the phase shift, whose values are identical for both beams.

An alternating magnetic field $h_o \sin 2\pi ft$ is produced by the current, traversing a coil, supplied by a generator 15. The direction of this alternating magnetic field is parallel to the light propagation and is superimposed on the field h to be measured. The Faraday rotation angle $\theta$ is consequently dependent on time in accordance with the relation $\theta = A(h + h_o \sin 2\pi ft)$, in which A is a constant dependent on the type of magnetooptical medium used and on its length.

The current $i_d$ detected at the output of photodetector 12 is filtered around the frequency f by a filter 14 and around the frequency 2f by a filter 17. At the output of filter 14 is obtained a signal B, whose amplitude is proportional to h, in accordance with the expression $K_1 Ah \sin \Omega t$, in which $K_1$ is a proportionality factor dependent on the product $Ah_o$ and on the phase shift $\phi$ of the light wave along the feedback loop, between the input and output of the laser cavity ($\Omega = 2\pi f$). At the output of filter 17 is obtained a signal, whose amplitude is constant in accordance with $K_2 \cos 2\Omega t$, in which $K_2$ is dependent on $Ah_o$ and $\phi$.

Figure 2:
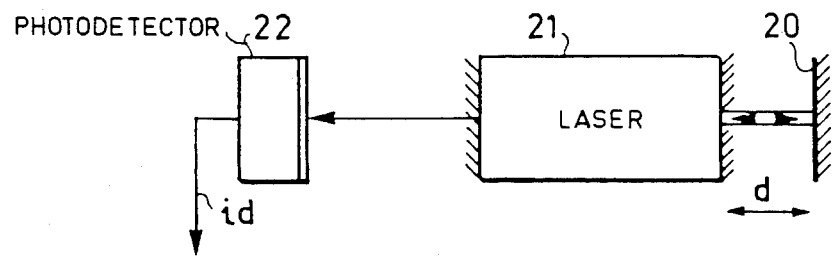
FIG. 2 a diagram showing a laser with recoupling by the reflected light.

It is known that if a mirror 20 (FIG. 2) is placed perpendicular to the beam of a laser 21, the power of the laser fluctuates as a function of the distance d of mirror 20 from laser 21. This power measured by detector 22 passes through a maximum when the reflected amplitude is in phase with that of the laser, and through a minimum when these two amplitudes are in phase opposition. To optimize the arrangement of FIG. 1, it is consequently necessary to optimize phase $\phi$.

On referring to FIG. 1, an optical phase shifter 13 is introduced into the feedback loop in order to adjust the value of $\phi$ by control 18, so as to make maximum the amplitude of the output signal of filter 17, i.e. $K_2$, read on indicator 19. This optimization makes it possible to also make factor $K_1$ maximum as a function of the product $Ah_o$, A being fixed for a given magnetooptical material, as will be seen hereinafter.

Thus, any variation of the phase shift $\phi$ under the effect of external parameters, particularly the temperature, has no influence on the measurement of h, because the phase shift $\phi$ can be permanently adjusted during the measurement. Moreover, the device is consequently at its maximum sensitivity.

The known techniques of guided optics are used for producing the magnetometer according to the invention. In particular, the light is propagated from one face to the other of the laser cavity by means of an optical fiber. This optical fiber is chosen in such a way as to retain the light polarization, as is for example described in an article by R. E. WAGNER et al, Electronics Letters, Vol. 17, No. 5 of 5.3.1981, pp.177/8.

Figure 3:
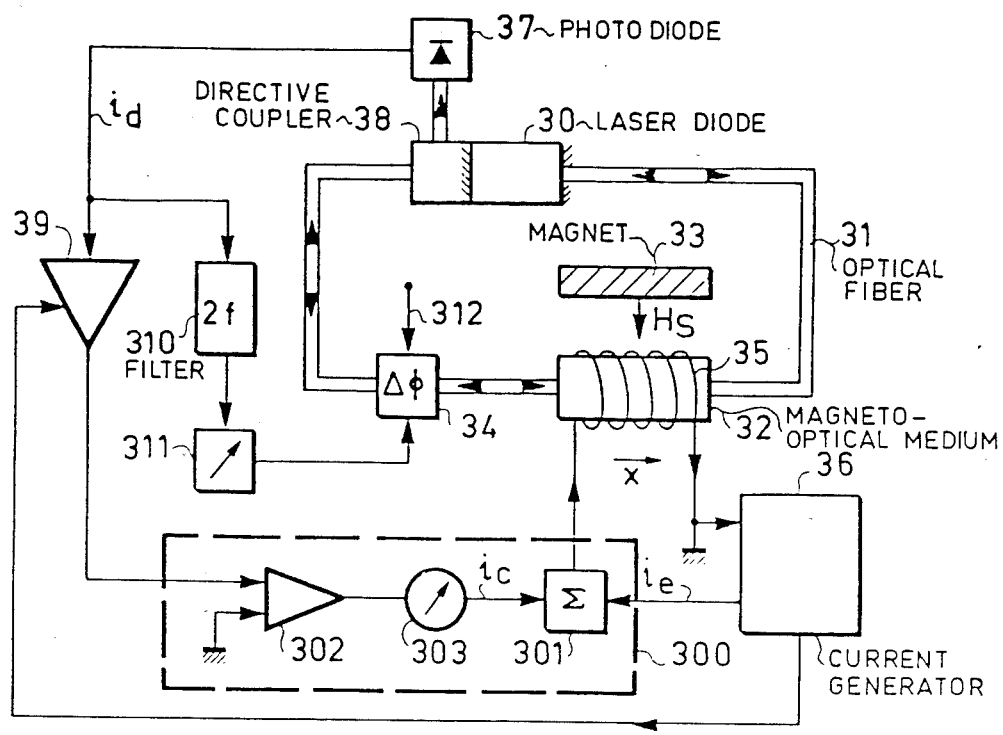
FIG. 3 a diagram of an optical magnetometer with its processing circuits according to the invention.

The preferred embodiment of the invention is shown in FIG. 3, in which an optical fiber 31 maintaining the polarization of the light is used for connecting the two output faces of a laser diode 30 to a magnetooptical medium 32. The wavelength $\lambda$ of the laser diode is chosen in such a way as to be matched to the magnetooptical medium used (optimum absorption/Faraday rotation ratio).

According to this preferred embodiment of the invention, the magnetooptical medium 32 is a ferrimagnetic material having spontaneous magnetization. In the case of such materials, it is known that by applying a so-called saturation magnetic field $H_S$ orienting all the magnetic domains in the same direction, rotation $\theta$ is given by: $\theta = (\theta_o/H_S)Lh$, in which $\theta_o$ is the specific Faraday rotation, obtained for a field $\geq H_S$, L being the length of the material traversed.

Thus, the rotation $\theta$ is proportional to the field h, and the value A, indicated hereinbefore, is equal to $(\theta_o/H_s)$. By making an analogy with materials having induced magnetization for which the rotation is proportional to the following field CLh, C being the Verdet's constant of the material, the ratio $(\theta_o/H_S)$ represents an "apparent" Verdet's constant $C_A$. The latter has a much higher value than C, namely approximately $10^6$ times. Thus, it is of interest, for reducing length L, to use a material having a spontaneous magnetization.

According to the preferred embodiment of the invention, the material used for forming the magnetooptical medium has a high "apparent" Verdet's constant, easy magnetization in one plane and a weak saturation field.

Figure 4:
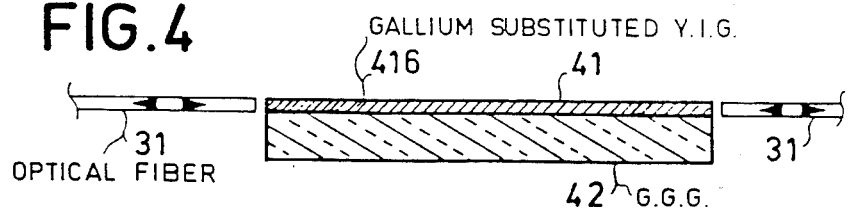
FIG. 4 the coupling of an optical fiber with a ferrimagnetic material layer deposited by epitaxy.

The formation of the magnetooptical medium is diagrammatically shown in section in FIG. 4. It is advantageously constituted by a gallium and gadolinium substituted yttrium-iron garnet layer 41. This layer is obtained by epitaxy on a gadolinium-gallium garnet substrate 42, called GGG. The coupling between the layer and the fiber is directly obtained.

The saturation field $H_S$ is applied in the plane of the layer 41 perpendicular to the light propagation direction, using a permanent magnet 33 or a solenoid. To obtain a single-domain layer, it is merely necessary to have a weak intensity field of approximately 80 A/m.

The alternating exciting magnetic field $h_o \sin 2\pi ft$ is applied to the magnetooptical medium by means of a solenoid 35 which surrounds the latter, its axis coinciding with the light propagation direction. This solenoid is supplied by generator 36 at frequency f.

This device comprises a photodiode 37, which intercepts part of the light leaving by one of the faces of the laser diode, either directly, or by means of a guided optics directional coupler, 38, placed against one of the faces of the laser diode. The electrical intensity $i_d$ supplied by the photodiode is filtered around frequency f and demodulated by a synchronous detection amplifier 39 receiving the reference current from generator 36. This intensity is also filtered around frequency 2f in 310. The component of $i_d$ at frequency f is transmitted into a group of circuits 300 supplying the value of the field h, to be measured by a zero method. On magnetic field $h_o$ is superimposed a magnetic compensation field, by injecting a direct or very low frequency current $i_c$ into coil 35, said current being added to the exciting current $i_E$ in adder 301. It is obtained at the output of a differential amplifier 302, which receives the demodulated component of $i_d$ at frequency f. The measurement of the field is directly obtained on indicator 303, which symbolizes any data acquisition system used in such cases.

Figure 5:
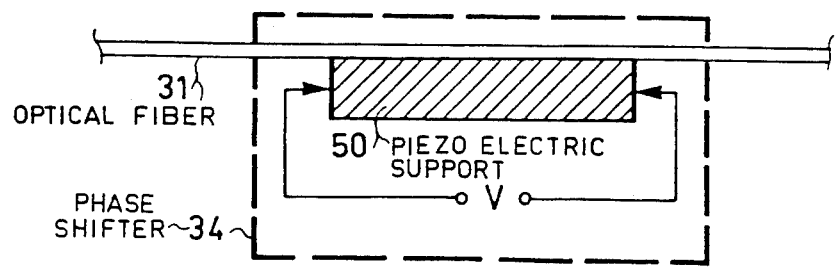
FIG. 5 the diagram of a strained optical fiber phase shifter.

The device incorporates a variable optical phase shifter 34 shown in FIG. 5. This phase shifter is realized by means of a piezo-electric support 50 in the form of a wafer, to which is bonded optical fiber 31 in such a way that it is rendered integral with the support. A variable voltage V is applied to the terminals of the wafer and the resulting optical path variations make it possible to adjust the phase shift. Prior to the measurements, the phase shifter is controlled at 312, so as to make maximum the amplitude of the signal from filter 310, indicated by circuit 311. During the measurement, circuit 311 automatically controls the phase shifter, so as to maintain said amplitude maximum. According to a variant of the invention, the magnetooptical medium is constituted by the transmission optical fiber. As the Verdet's constant of the materials forming the fibers is generally low, the fiber has a considerable length, namely several hundred meters, in order to obtain an adequate sensitivity. Thus, the fiber is wound in the form of a flat coil, in order to form turns, which are placed within the exciting coil, the transverse saturation field $H_S$ then no longer being necessary.

The aforementioned device makes it possible to detect relative variations of component $i_d$ of approximately $10^{-6}$.

The laser emission wavelength is, for example, equal to 1.2 $\mu$m and the core diameter of the optical fiber is equal to approximately 5 $\mu$m.

The following characteristics are obtained with a magnetooptical medium formed by a thin GaGdYIG layer:

$\theta_o = 4.3 \; 10^2$ rad/m $H_S = 80$ A/m

L = 1 cm $h_o = 24$ A/m h minimum detectable $= 10^{-5}$ A/m.

The following characteristics are obtained with a magnetooptical medium constituted by a silica fiber:

Verdet's constant $C = 1.1 \times 10^{-6}$ rad/m(A/m)

L = 1000 m $h_o = 130 \text{A/m}$ h minimum detectable $= 3 \times 10^{-4}$ A/m.

What is claimed is:

1. An optical magnetometer for measuring the component h of a magnetic field in a direction x, comprising:

laser means having first and second opposite faces, for supplying linear polarized light through said faces;

first polarization-retaining optical transmission means, coupled to said first face, for carrying said light;

magneto-optical means, having a first coupling end and a second coupling end coupled to said first transmission means and arranged so that light entering said magneto-optical means travels in a direction parallel to x, for producing a Faraday effect on said light;

means for inducing in said magneto-optical means an alternating magnetic field superimposed on said component h parallel to said direction x and having a frequency f;

second polarization-retaining optical transmission means, coupled to said second face and said first coupling end, for carrying said light to cause said light from said first and second faces to travel in opposite directions and return to said laser means at a face opposite the face said light was transmitted through, to cause said light traveling in opposite directions to be recoupled at said laser means;

optical transmission means, coupled to said second face, for receiving a portion of said recoupled light;

photodetector means, coupled to said optical transmission means, for producing a signal $i_d$ corresponding to said recoupled light; and first filter means, coupled to said photodetector means, for filtering said signal $i_d$ at said frequency f and providing an output signal proportional to said component h.

2. An optical magnetometer according to claim 1, further including:

a controllable optical phase shifter inserted onto one of said first and second transmission means;

second filter means, coupled to said photodetector means, for filtering said signal $i_d$ at a frequency twice said frequency f and delivering to said controllable phase shifter a first feedback control signal for adjusting a value of said signal $i_d$ to a maximum.

3. An optical magnetometer according to claim 2, wherein said phase shifter includes a piezoelectric wafer onto which is bonded said one of said first and second transmission means, and means for applying to said wafer said feedback control signal.

4. An optical magnetometer according to claim 3, further including control means, coupled to said first filter means and to said inducing means, for receiving said output signal and delivering to said inducing means a second feedback control signal for controlling said inducing means to cause said inducing means to further induce a magnetic compensation field which zeroes said component h, whereby said second feedback control signal measures the value of said component h.

5. An optical magnetometer according to claim 4, wherein said inducing means includes a coil surrounding said magneto-optical means and having an axis parallel to said direction x, a generator supplying an alternating current having said frequency f, and wherein said control means includes a synchronous detection amplifier receiving said signal $i_d$ and said alternating current, a differential amplifier connected to said amplifier and delivering said second feedback control signal, and an adder receiving said alternating current and said second feedback control signal and supplying said coil.

6. A magnetometer according to claim 5, wherein said magneto-optical means includes a thin layer of yttrium-iron garnet with gallium and gadolinium substitution, grown by epitaxy on the gadolinium gallium garnet.

7. An optical magnetometer according to claim 5, wherein said magneto-optical means includes a layer of ferrimagnetic material having spontaneous magnetization, and a permanent magnet producing a saturation magnetic field perpendicular to said direction x in a plane of said ferrimagnetic material having easy spontaneous magnetization.

8. A magnetometer according to claim 1, wherein said magneto-optical means includes a paramagnetic material with induced magnetization.

9. A magnetometer according to claim 8, wherein said magneto-optical means includes a paramagnetic optical fiber.

10. A magnetometer according to claim 1, wherein said laser is a semiconductor laser emitting a wavelength in a transparency range of said magneto-optical means and having an optimum absorption/Faraday rotation ratio.

* * * * *